United States Patent [19]
Edwards

[11] Patent Number: 5,304,957
[45] Date of Patent: Apr. 19, 1994

[54] LOW JITTER PHASE LOCKED LOOP FOR SINGLE PHASE APPLICATIONS

[75] Inventor: Charles W. Edwards, Monroeville Boro, Pa.

[73] Assignee: Westinghouse Electric Corp., Pittsburgh, Pa.

[21] Appl. No.: 955,553

[22] Filed: Oct. 1, 1992

[51] Int. Cl.$^5$ .............................................. H03L 7/06
[52] U.S. Cl. ........................................ 331/12; 331/17; 331/18; 331/25
[58] Field of Search ....................... 331/11, 12, 17, 25, 331/18

[56] References Cited

U.S. PATENT DOCUMENTS

| | | | |
|---|---|---|---|
| 4,348,641 | 9/1982 | Scott et al. | 329/308 X |
| 4,384,357 | 5/1983 | deBuda et al. | 329/302 X |
| 4,669,024 | 5/1987 | Stacey | 361/85 |
| 4,757,415 | 7/1988 | Smith et al. | 361/76 |
| 4,963,839 | 10/1990 | Stacey | 331/17 |
| 5,065,107 | 11/1991 | Kumar et al. | 331/12 X |

*Primary Examiner*—Siegfried H. Grimm
*Attorney, Agent, or Firm*—R. P. Lenart

[57] ABSTRACT

A circuit for producing an output signal representative of the phase angle of a single phase input signal includes a phase shift generator for receiving a single phase input signal and for generating a quadrature signal and a direct signal in response to the single phase input signal, and a phase locked loop coupled to the phase shift generator for generating an output signal in response to the quadrature and direct signals such that the output signal is phase locked with the single phase input signal. A method is also provided for producing an output signal representative of the phase angle of a single phase input signal, comprising the steps of: receiving a single phase input signal; generating a quadrature signal and a direct signal in response to the single phase input signal; and generating an output signal in response to the direct and quadrature signals, such that the output signal is phase locked with the single phase input signal.

6 Claims, 2 Drawing Sheets

LOW JITTER PHASE LOCKED LOOP FOR SINGLE PHASE APPLICATIONS

BACKGROUND OF THE INVENTION

This invention relates to phase locked loops and, more particularly, to phase locked loops for use with single phase circuits.

The control circuits of many types of power electronic equipment need a stable, accurate reference of the angle of the input power for use by other parts of the control. A phase-locked loop (PLL) is often used for this purpose. In a single phase system, it is difficult to derive a phase reference which does not have cycle-by-cycle phase modulation (jitter) unless noise sensitive edge triggered methods or very heavy, and therefore slowly responding, loop filters are used.

In three phase systems, it is possible to vectorially sum components of the three phase voltages to obtain a quadrature set of sine waves which can be used by the phase comparator of a PLL to generate a phase error signal which has a constant value proportional to the sine of the input phase angle minus the voltage controlled oscillator (VCO) phase angle and (optionally) plus a constant. For example, if a direct component derived from the three phase input is proportional to sin(a) and the quadrature component is proportional to −cos(a), the phase error can be calculated as follows:

$$
\begin{aligned}
\text{Phase Error} &= -\sin(a)\cdot\sin(b)-\cos(a)\cdot\cos(b) \\
&= -\cos(a-b)/2+\cos(a+b)/2 - \cos(a-b)-\cos(a+b) \\
&= -\cos(a-b) \\
&= \cos(a-b+\pi)
\end{aligned}
$$

where "a" is the phase angle of the line and "b" is the phase angle of the VCO. Other implementations with different steady state phase shifts are also possible.

In the ideal case, the phase error has no ripple after settling and no phase modulation of the VCO will result. Even in a practical system, the ripple which results from negative sequence and harmonic voltages is small and only slight filtering is usually required. In a single phase system, it is not possible to use vector summation to construct a quadrature set of sine waves. No scaling can make a sine wave out of a cosine wave since they are orthogonal. A phase comparator can be constructed without quadrature inputs, but the output will have a large ripple component at twice the input frequency in the steady state. Although the DC average of the phase comparator output is proportional to the sine of the phase error, the ripple can cause objectionable phase modulation even when heavy filtering is used. For example, if the input to the PLL is proportional to cos(a) and the VCO output is cos(b), then:

$$
\begin{aligned}
\text{Phase Error} &= \cos(a)\cdot\cos(b) \\
&= \cos(a-b)/2+\cos(a+b)/2
\end{aligned}
$$

In the steady state, the frequency of a and b will be the same, only a phase angle difference (possibly zero) will exist. In that event:

$$
\begin{aligned}
\text{Phase Error} &= \cos(a-b)/2+\cos(a+b)/2 \\
&= \cos(a-a+\Phi)/2+\cos(a+a+\Phi)/2 \\
&= \cos(\Phi)/2+\cos(2\cdot a+\Phi)/2
\end{aligned}
$$

In the above equations, the phase error consists of a DC term proportional to the cosine of the angular difference and a twice frequency ripple term of significant magnitude.

Some means of phase shifting using delays, filters or integrators can be used to develop a quadrature set of inputs. However, these techniques do not provide satisfactory performance. This invention seeks to provide an accurate and stable source of the angle of an input sine wave for use in controlling single phase power electronic equipment or other control systems requiring filtered angle references.

SUMMARY OF THE INVENTION

This invention uses a controlled phase shift generator placed ahead of a quadrature phase comparator in a single phase system to obtain results as good as found in prior art three phase systems. Circuits constructed in accordance with this invention include a phase shift generator for receiving a single phase input signal and for generating a quadrature signal and a direct signal in response to the single phase input signal. A phase locked loop (PLL) is coupled to the phase shift generator to receive the quadrature and direct signals. The PLL uses these signals to generate an output signal which is phase locked with the single phase input signal.

This invention also encompasses a method for producing an output signal representative of the phase angle of a single phase input signal, and/or a sine and cosine signal with the same frequency and a fixed phase with respect to the input signal, comprising the steps of: receiving a single phase input signal; generating a quadrature signal and a direct signal in response to the single phase input signal, with the quadrature signal and direct signal having the same amplitude; and generating an output signal in response to the direct and quadrature signals, such that the output signal is phase locked with the single phase input signal.

BRIEF DESCRIPTION OF THE DRAWING

The invention will be more readily apparent to those skilled in the art by reference to the accompanying drawings wherein.

DESCRIPTION OF THE PREFERRED EMBODIMENT

Figure 1:
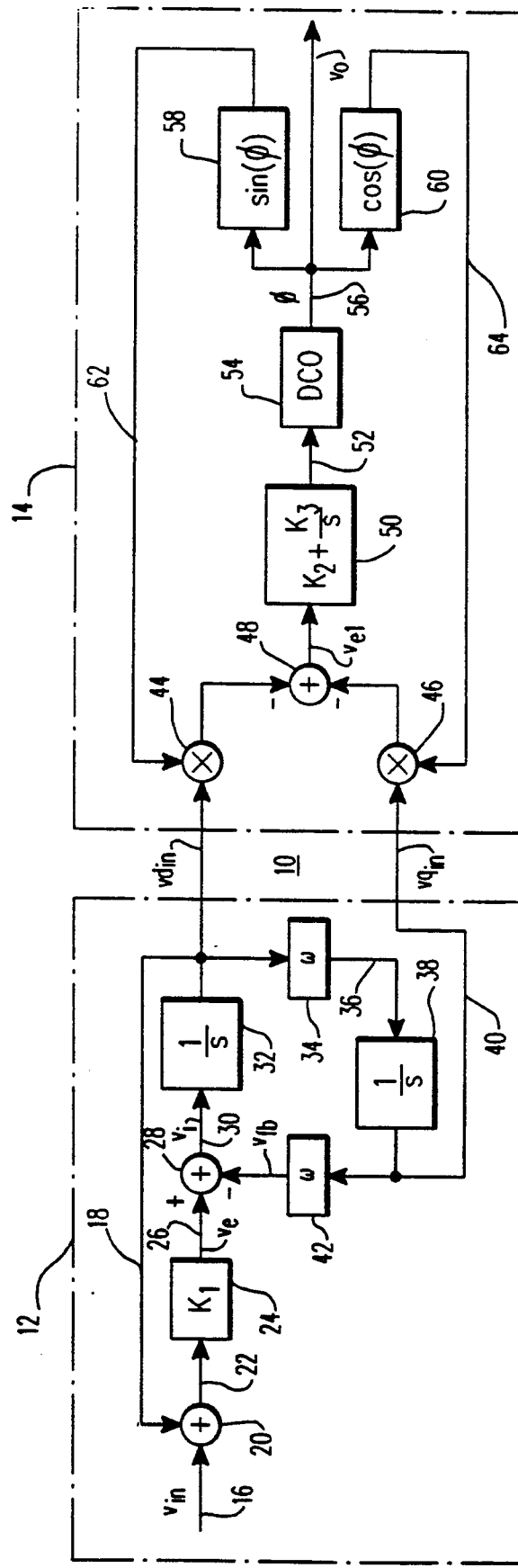
FIG. 1 is a block diagram of a circuit constructed in accordance with the present invention.

Referring to the drawings, FIG. 1 is a block diagram of a circuit constructed in accordance with one embodiment of the present invention. The circuit 10 includes a phase shift generator 12 coupled to a phase-locked loop 14 as shown. The phase shift generator includes an input line 16 for receiving a single phase input signal $v_{in}$, representative of the a signal in an associated circuit which is being monitored. In one application of the invention, the input signal may be a signal representative of a line voltage in an associated power circuit. The input signal is combined with a direct feedback signal $vd_{in}$ on line 18 at summation point 20 to produce a difference signal on line 22. The difference signal on line 22 is amplified by an amplifier 24 having a gain $K_1$ to produce an error signal $v_e$ on line 26. Summation point 28 subtracts a feedback signal $v_{fb}$ from the error signal to produce an intermediate signal $v_i$ on line 30. This intermediate signal is integrated in integrator 32 to produce the direct feedback signal $vd_{in}$. In the steady state, $vd_{in}$ will have the same phase as $v_{in}$ and $vq_{in}$ will lag $vd_{in}$ by 90 degrees.

A weighing constant $\omega$ is applied to the direct signal $vd_{in}$ by scaling circuit 34 to produce another intermediate signal on line 36 which is integrated by integrator 38 to produce a quadrature signal $vq_{in}$ on line 40. A second scaling circuit 42 applies weighing constant $\omega$ to the quadrature signal to produce the feedback signal $v_{fb}$. Circuit parameters are selected such that signals $vd_{in}$ and $vq_{in}$ have the same amplitude.

The direct and quadrature signals are applied to multipliers 44 and 46 respectively in phase locked loop 14, which is constructed in accordance with know techniques. Summation point 48 receives the outputs of multipliers 44 and 46 and produces an error signal $v_{el}$ which is passed to a proportional plus integral (PI) circuit 50. The PI circuit produces a signal on line 52 which serves as a control signal for a digitally controlled oscillator (DCO) 54. The DCO then produces an output signal $v_o$ on line 56 which in this embodiment is a binary representation of the phase angle of the input signal $v_{in}$. Sine and cosine look-up tables, 58 and 60 respectively, are used to produce feedback signals on lines 62 and 64.

As can be seen from the above description of the preferred embodiment, this invention uses $v_{in}$ as a setpoint and $vd_{in}$ as a feedback to generate two quadrature sine waves. The feed-forward gain K1 amplifies the error between $v_{in}$ and $vd_{in}$. The transfer function from $v_e$ to $vd_{in}$ is $s/(s^2+x_s^2)$. Since $s=jx$, the frequency response is $jx/(-x^2+x_s^2)$, which has an infinite gain at frequency $x_s$. This is analogous to a conventional integral controller which has an infinite gain at DC. Since the gain is infinite at the desired frequency, the steady state error between $v_e$ and $vd_{in}$ is zero. In addition, the gain from $vq_{in}$ to $vd_{in}$ at frequency $x_s$ is one with a phase shift of $-\pi$. Signals $vq_{in}$ and $vd_{in}$ are applied to the inputs to the PLL in a manner used in prior art three phase circuits.

This invention can be implemented in analog or digital form. In either form, the invention provides a method for producing an output signal representative of the phase angle of a single phase input signal comprising the steps of: receiving a single phase input signal; generating a quadrature signal and a direct signal in response to the single phase input signal; and generating an output signal in response to the direct and quadrature signals, such that the output signal is phase locked with the single phase input signal.

In an alternative embodiment, the DCO in FIG. 1 could be replaced by a voltage controlled oscillator (VCO) and a counter could be used to provide inputs to the sine and cosine look-up tables. The invention has been implemented in digital form using an Analog Devices ADSP-2101 Digital Signal Processor with the program code listed in Appendix A. The nominal update rate for the loops of 14400 Hz was set by the DCO. Since the scale factors for the integrators are constant, the gain of the integrators in the phase shift generator proportional to the DCO frequency which is a multiple of the input frequency (240 in the implemented case). The gain at 60 Hz will be K*60 and it will be K*50 at 50 Hz, where K is a predetermined constant. This is what is required to allow the phase shift generator to adapt to different input frequencies.

Figure 2:
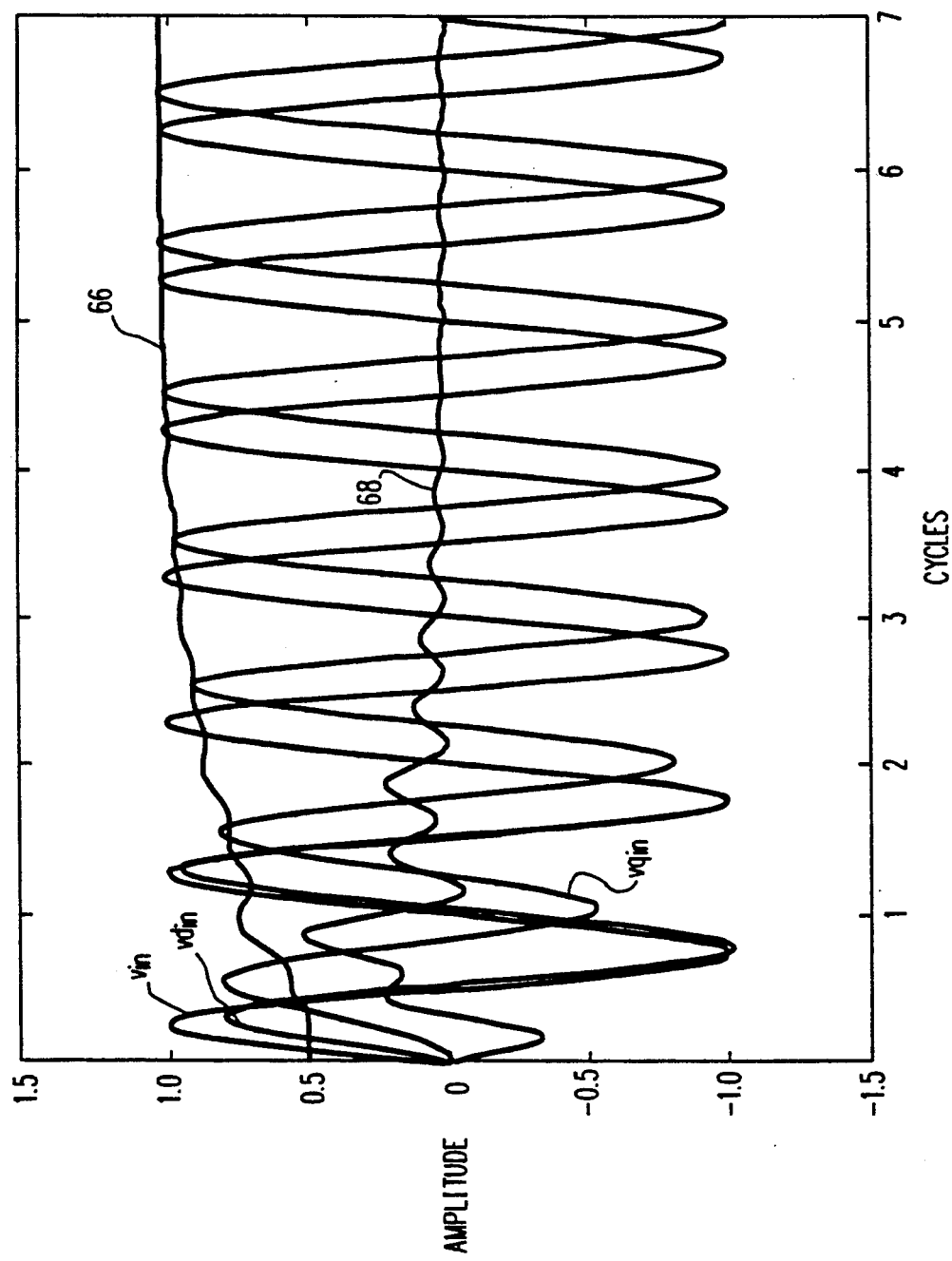
FIG. 2 shows a series of computer generated waveforms which simulate the operation of the circuit of FIG. 1.

FIG. 2 shows a series of computer generated waveforms which simulate the operation of the circuit of FIG. 1. FIG. 2 shows the input signal $v_{in}$, the direct signal $vd_{in}$, the quadrature signal $vq_{in}$, the per unit frequency as illustrated by curve 66, and the phase locked loop angle error signal as illustrated by curve 68.

This invention can be used to derive a stable and accurate angle reference for use in control systems which must have a minimum of cycle-by-cycle phase modulation and jitter to achieve their performance requirements. Although the invention has been described in terms of its preferred embodiment, it will be apparent to those skilled in the art that various modifications can be made without departing from the scope of the invention. For example, the direct and quadrature signals identified in FIG. 1 could be interchanged while still achieving the same result. In addition, the functions in blocks 34 and 36 could be performed in a single device. It is therefore intended that the following claims cover such modifications.

APPENDIX A

```
{*************************************************}
{                                                   }
{       calculate vd_in and vq_in from vin         }
{       vin_error = vin - vd_in                    }
{       old_vd_in=vd_in;                           }
{       vd_in = vd_in + K * vin_error - H * vq_in  }
{       vq_in = vq_in + H * old_vd_in              }
{       H = w * DT, K = K' * DT                    }
{                                                   }
{*************************************************}

AY0=DM(vd_in);          { old_vd_in }
AX0=DM(vin);
AR=AX0-AY0;
DM(vin_error)=AR;

MR=0;
MX0=MINUS1;
```

```
MY0=AY0;                    { old_vd_in }
MR=MR-MX0*MY0 (SS);

MX0=K_IN;                   { K }
MY0=DM(vin_error);
MR=MR+MX0*MY0 (SS);

MX0=H_IN;                   { H }
MY0=DM(vq_in);              { old_vq_in }
MR=MR-MX0*MY0 (RND);
IF MV SAT MR;
MY0=DM(vd_in);              { old_vd_in }
DM(vd_in)=MR1;              { save vd_in }

MR=0;                       { clear mac }
MR=MR+MX0*MY0 (SS);
MX0=MINUS1;
MY0=DM(vq_in);              { old_vq_in }
MR=MR-MX0*MY0 (RND);
IF MV SAT MR;
DM(vq_in)=MR1;              { save vq_in }
```

```
{*****************************************************************}
{                                                                 }
{       phase-locked loop phase detector routine                  }
{                                                                 }
{ the phase-locked loop phase detector determines the phase error }
{ by calculating:                                                 }
{                                                                 }
{       phase error = vq_in * cos(theta) - vin * sin(theta)       }
{                                                                 }
{ the resulting phase error is then low pass filtered.            }
{                                                                 }
{*****************************************************************}
```

```
I4=DM(theta);              { get angle (already has base offset)       }
AX0=I4;                    { save angle for use in sine retrieval      }
M4=1;                      { increment angle by one count each pass    }
L4=%COS_TABLE;             { modulo length of cosine table             }
MR=0;                      { clear mac                                 }
MX0=DM(vq_in);             { get quadrature input voltage              }
MY0=PM(I4,M4);             { get cos(theta)                            }
DM(cos_theta)=MY0;         { save cos(theta) for later use             }
MR=MR+MX0*MY0(SS);         { multiply vq_in * cos(theta) and accumulate}

DM(theta)=I4;              { save theta for next pass                  }
I4=AX0;                    { recover theta for this pass               }
M4=180;                    { increment by 3*PI/2 to get sine           }
MODIFY(I4,M4);             { add 180 modulo 240                        }

MX0=DM(vd_in);             { get direct input voltage                  }
MY0=PM(I4,M4);             { get sin(theta)                            }
DM(sin_theta)=MY0;         { save sin(theta) for later use             }
MR=MR-MX0*MY0(RND);        { multiply vd_in by sin(theta) and accumulate}

IF MV SAT MR;              { MR1 now contains phase error              }
AX0=DM(phase_error);       { get old phase error                       }
DM(phase_error)=MR1;       { save new phase error                      }
```

```
{*****************************************************************}
{                                                                 }
{   phase-locked loop proportional-integral controller routine    }
{                                                                 }
{           the pi controller output is given by:                 }
{                                                                 }
{       y(t) = y(t-1) + ki*[0.5*x(t)+0.5*x(t-1)]*dt               }
{       z(t) = y(t) + kp*x(t)                                     }
{                                                                 }
{            where:  y(t)    = present integrator output          }
{                    x(t)    = present phase detector output      }
{                    x(t-1)  = previous phase detector output     }
{                    y(t-1)  = previous integrator output         }
{                    z(t)    = proportional - integral output     }
{                    ki      = integral gain                      }
{                    kp      = proportional gain                  }
{                    dt      = time between samples               }
{                                                                 }
{*****************************************************************}

MX0=MR1;                { MX0 now contains the phase detector output }
MR=0;
MR1=DM(phase_error_int); { get y(t-1)                                }
MY0=80;                  { load MY0 with 0.5*ki*dt                   }

MR=MR+MX0*MY0(SS);  { calculate x(t)*0.5*ki*dt and add to y(t-1)}
MX0=AX0;                 { get previous phase detector output    }
MR=MR+MX0*MY0(RND);
IF MV SAT MR;
DM(phase_error_int)=MR1;{ save the present integrator output    }

MX0=DM(phase_error);     { get the present phase detector output}
MY0=MINUS1;              { proportional gain factor of -1 (subtracted)}
MR=MR-MX0*MY0(RND);      { add in the proportional gain          }
IF MV SAT MR;
DM(pll_pi_out)=MR1;

{*****************************************************************}
{              phase-locked loop dco routine                      }
{                                                                 }
{ This routine functions as a DCO                                 }
{ by using the PI controller output to determine the 2101 timer   }
{ period value. This value is then loaded into the timer period   }
{ register in data memory location 3FFD. When a timer timeout     }
{ occurs, a jump to the timer interrupt routine which then        }
{ increments the pointers in the sine/cosine table.               }
{                                                                 }
{ As the output of the PI controller output goes                  }
{ positive, the timer period is increased. Likewise, as the PI    }
{ controller output goes negative the timer period is decreased.  }
{ The timer period can be varied over a range sufficient to       }
{ provide phase lock for line frequencies from 45 (769) to 65     }
{ (1111) Hz. The nominal period is (1111+769)/2 = 940.            }
{*****************************************************************}

MX0=DM(pll_pi_out);
MR=0;
MR1=NOMINAL_TIMER;     { nominal timer period of 940 }
MY0=TIMER_RANGE_SCALE; { scale factor }
MR=MR+MX0*MY0(RND);    { calculate new timer period value }
DM(TPERIOD_REG)=MR1;   { update timer period value }

{ end of pll }
```

I claim:

1. A circuit comprising:
   a phase shift generator for receiving a single phase input signal and for generating a quadrature signal and a direct signal in response to said input signal; and
   a phase locked loop coupled to said phase shift generator for generating an output signal in response to said quadrature and direct signals, said output signal being phase locked with said input signal;
   where said phase shift generator comprises means for combining said single phase input signal and a selected one of said direct and quadrature signals to produce a first error signal; means for deriving a first feedback signal from said selected one of said direct and quadrature signals; means for combining said first error signal with said first feedback signal to produce a second error signal; and means for producing said selected one of said direct and quadrature signals in response to said second error signal.

2. A circuit according to claim 1, wherein said phase shift generator further comprises:
   means for producing a non-selected one of said direct and quadrature signals in response to said selected one of said direct and quadrature signals.

3. A circuit according to claim 2, wherein said phase locked loop comprises:
   means for combining said selected one of said direct and quadrature signals with a signal representative of the sine of said output signal to produce a first intermediate signal;
   means for combining said non-selected one of said direct and quadrature signals with a signal representative of the cosine of said output signal to produce a second intermediate signal;
   means for combining said first and second intermediate signals to produce a third error signal; and
   means for producing said output signal in response to said third error signal.

4. A method for producing an output signal representative of the phase angle of a single phase input signal, said method comprising the steps of:
   receiving a single phase input signal;
   generating a quadrature signal and a direct signal in response to said single phase input signal, said quadrature signal and direct signal having the same amplitude; and
   generating an output signal in response to said direct and quadrature signals, said output signal being phase locked with said single phase input signal;
   wherein said step of generating a quadrature signal and a direct signal in response to said single phase input signal comprises the steps of combining said single phase input signal and a selected one of said direct and quadrature signals to produce a first error signal; deriving a first feedback signal from said selected one of said direct and quadrature signals; combining said first error signal with said first feedback signal to produce a second error signal; and producing said selected one of said direct and quadrature signals in response to said second error signal.

5. A method for producing an output signal representative of the phase angle of a single phase input signal according to claim 4, wherein said step of generating a quadrature signal and a direct signal in response to said single phase input signal further comprises the step of:
   producing a non-selected one of said direct and quadrature signals in response to said selected one of said direct and said quadrature signals.

6. A method for producing an output signal representative of the phase angle of a single phase input signal according to claim 5, wherein said step of generating an output signal in response to said direct and quadrature signals comprises the steps of:
   combining a selected one of said direct signal and said quadrature signal with a signal representative of the sine of said output signal to produce a first intermediate signal;
   combining a non-selected one of said direct and quadrature signals with a signal representative of the cosine of said output signal to produce a second intermediate signal;
   combining said first and second intermediate signals to produce a third error signal; and
   producing said output signal in response to said third error signal.

* * * * *